(12) United States Patent
Chen

(10) Patent No.: US 9,319,764 B2
(45) Date of Patent: *Apr. 19, 2016

(54) MEMS MICROPHONE PACKAGING STRUCTURE

(71) Applicant: Merry Electronics CO., Ltd., Taichung (TW)

(72) Inventor: Jen-Yi Chen, Taichung (TW)

(73) Assignee: MERRY ELECTRONICS CO., LTD., Taichung (TW)

(*) Notice: Subject to any disclaimer, the term of this patent is extended or adjusted under 35 U.S.C. 154(b) by 270 days.

This patent is subject to a terminal disclaimer.

(21) Appl. No.: 13/790,219

(22) Filed: Mar. 8, 2013

(65) Prior Publication Data

US 2014/0254851 A1 Sep. 11, 2014

(51) Int. Cl.
*H04R 1/04* (2006.01)
*H04R 19/00* (2006.01)
*H01L 29/84* (2006.01)

(52) U.S. Cl.
CPC ............ *H04R 1/04* (2013.01); *B81B 2201/0257* (2013.01); *H01L 29/84* (2013.01); *H04R 19/005* (2013.01); *H04R 2201/003* (2013.01)

(58) Field of Classification Search
CPC ...................... B81B 3/0021; B81B 2201/0257; B81B 2203/0127; B81B 2207/09; B81B 7/0064; H04R 1/04; H04R 29/84; H04R 19/005; H04R 2201/003; H04R 23/006

USPC .................. 381/355, 173, 174, 369; 257/416; 438/51, 53

See application file for complete search history.

(56) References Cited

U.S. PATENT DOCUMENTS

| | | | | |
|---|---|---|---|---|
| 7,557,417 | B2* | 7/2009 | Theuss | B81B 7/0077 257/415 |
| 2007/0158826 | A1* | 7/2007 | Sakakibara | B81B 7/0064 257/723 |
| 2007/0202536 | A1* | 8/2007 | Yamanishi | C12Q 1/6881 435/7.1 |
| 2008/0083957 | A1* | 4/2008 | Wei | B81B 7/0064 257/415 |
| 2009/0259424 | A1* | 10/2009 | Dutta | G01C 17/28 702/85 |
| 2011/0293126 | A1* | 12/2011 | Maekawa et al. | 381/355 |

* cited by examiner

*Primary Examiner* — Davetta W Goins
*Assistant Examiner* — Oyesola C Ojo
(74) *Attorney, Agent, or Firm* — WPAT, PC; Justin King

(57) ABSTRACT

The invention provides a MEMS microphone packaging structure for reducing the packaging structure volume, lowering manufacturing cost and improving impact resistance. The packaging structure has a large back cavity formed by a recess of a controlling chip and a deep hole of a MEMS microphone chip. The controlling chip is disposed on the MEMS microphone chip for protecting the MEMS microphone chip. A plastic molding process can be applied on the packaging structure. A plurality of pads on a base of the packaging structure are protected by sealant or primer for protection against corrosion under atmospheric condition. In conclusion, the invention has advantages of small volume and thinner thickness without downgrading the performance, and the manufacturing cost can be lowered.

12 Claims, 5 Drawing Sheets

MEMS MICROPHONE PACKAGING STRUCTURE

FIELD OF THE INVENTION

The invention relates to a micro-electro-mechanical system (MEMS) microphone packaging structure, in particularly to a MEMS microphone packaging structure that has a controlling chip stacked on a MEMS microphone chip. Besides, a recess formed on a back surface of the controlling chip and a deep hole formed on a back surface of the MEMS microphone chip can be connected to form an additional large back cavity. Sealant or primer is applied on pads in the MEMS microphone packaging structure to protect it from corrosion under atmospheric conditions.

BACKGROUND OF THE INVENTION

As mobile phones are becoming more popular, the requirements to acoustic quality of the mobile phones are gradually increased. Besides, the hearing aid technology is gradually becoming mature. Therefore, demands for high quality mini-sized microphones are sharply increased. Capacitive microphones manufactured by MEMS technologies have advantages including light weight, small volume, and better signal quality, which all make the MEMS microphone become the mainstream of the market of mini-sized microphone.

FIG. 5 is a schematic view of a conventional MEMS microphone packaging structure. The MEMS microphone packaging structure includes a base 90, a MEMS microphone chip 91, a controlling chip 92 and a packaging cover 93. The MEMS microphone chip 91 is sealed in a package formed by the base 90 and the packaging cover 93. The MEMS microphone chip 91 is controlled by the controlling chip 92. In this conventional structure, the MEMS microphone chip 91 and the controlling chip 92 are separately disposed on the base 90 and covered by the packaging cover 93 for protection.

However, the packaging structure has three disadvantages as follows: 1. The MEMS microphone chip 91 is typically disposed adjacent to the controlling chip 92, therefore a sufficiently large base 90 is needed for them to dispose on, thus the dimensions of the MEMS microphone packaging structure is not easy to reduce. 2. Wires 96 and pads 97 for connecting the MEMS microphone chip 91 and the controlling chip 92 to the base 90 are exposed in a containing space 94 of the MEMS microphone packaging structure. Moisture and dusts from the outside may enter the containing space 94 through a sound penetrating hole 95 formed on the base 90, and oxidize or damage the wires 96 and pads 97, and thus reduce the reliability. Accordingly, gold or other precious metal is used for making the pads 97 to prevent corrosion, however, the cost is high and the bonded wires may not be guaranteed not to detach. 3. The mechanical properties of the base 90 and the packaging cover 93 are not the same. In order to prevent thermal deformation of the base 90, the thickness of the base 90 is made thicker, and that consequently causes the thicker thickness of the entire packaging structure. There is room for improving the cost effectiveness and the reliability.

Therefore, it is needed to provide a novel MEMS microphone packaging structure to solve the above mentioned problem.

SUMMARY OF THE INVENTION

In order to solve the above mentioned problem that the dimensions of the conventional packaging structure are larger and the pads are made of expensive precious metal, the invention provides a MEMS microphone packaging structure, which is manufactured by integrated circuit plastic packaging technologies. The dimensions and the thickness of the packaging structure can be reduced, the cost can be lowered and the impact resistance can be improved, and the potential to further downsize the packaging structure is increased.

The invention provides a MEMS microphone packaging structure, which has a controlling chip stacked on a MEMS microphone chip. The MEMS microphone packaging structure uses integrated circuit plastic packaging process to apply sealant to protect the controlling chip and the MEMS microphone chip, and uses sealant or primer to protect the pads from corrosion under atmospheric conditions, thus expensive metal pad is no longer needed. Moreover, the packaging structure has an additional large back cavity formed by connecting a recess formed on a back surface of the controlling chip and a deep hole formed on a back surface of the MEMS microphone chip.

In conclusion, the invention has advantage of small volume without downgrading the performance. Besides, the packaging volume can be reduced and the manufacturing cost can be lowered.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
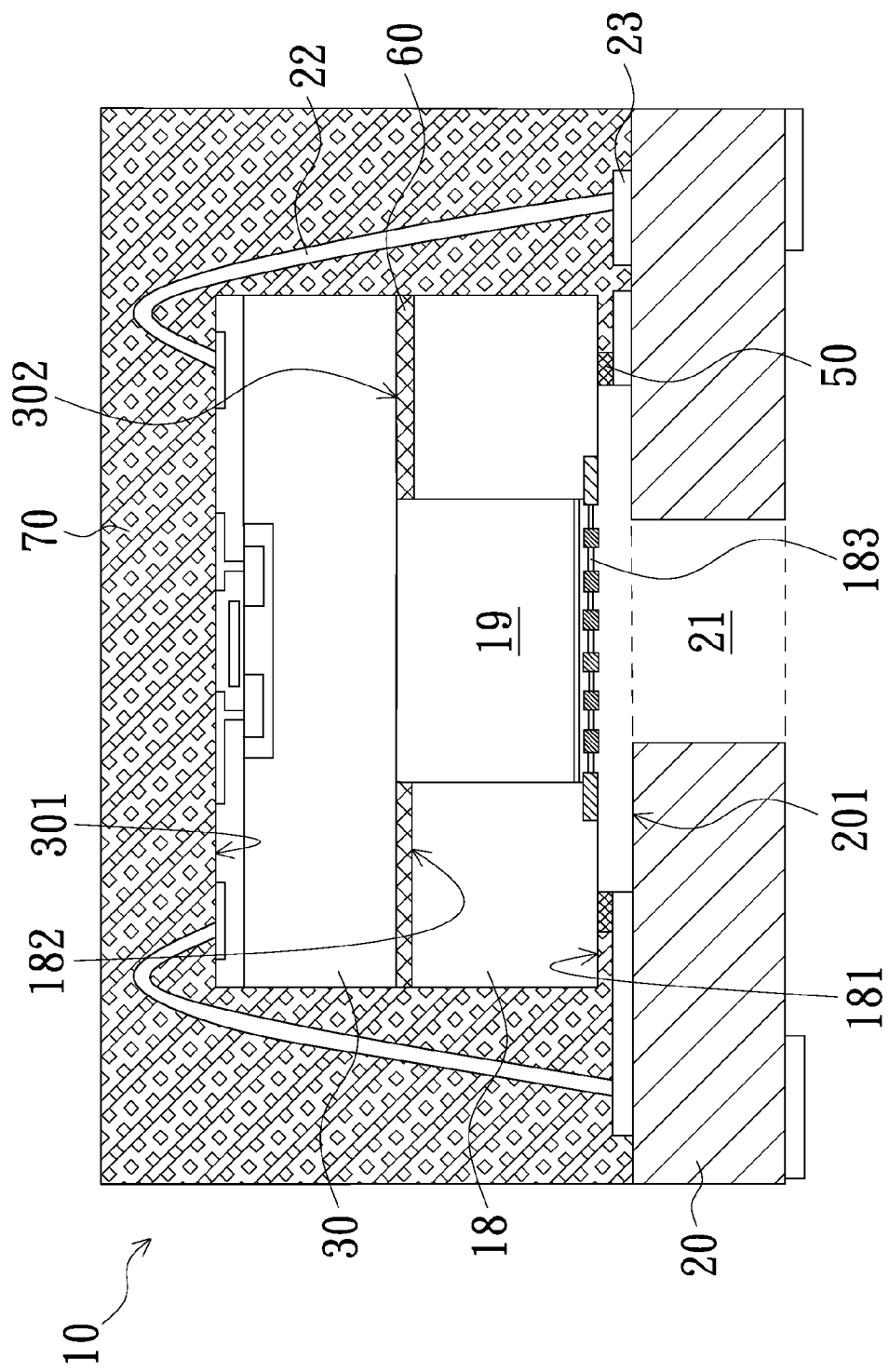
FIG. 1 is a schematic cross sectional view of a MEMS microphone packaging structure according to the first embodiment of the invention.

FIG. 1 is a cross sectional view of a MEMS microphone packaging structure according to the first embodiment of the invention. In this figure, the MEMS microphone packaging structure 10 includes a base 20, a MEMS microphone chip 18, a controlling chip 30 and a sealing material 70.

The base 20 has a through hole 21. Besides, the base 20 has a surface 201 and a plurality of pads 23 disposed on the surface 201 for electrically connected with the MEMS microphone chip 18.

The MEMS microphone chip 18 has a deep hole 19 for connecting to the through hole 21 of the base 20. A first surface 181 of the MEMS microphone chip 18 is electrically connected to the surface 201 of the base 20. The first surface 181 has a diaphragm 183 for receiving the acoustic waves passing through the through hole 21. Besides, in this embodiment, the first surface 181 is electrically connected to the pads 23 of the base 20 through a plurality of metal bumps 50.

The controlling chip 30 has a first surface 301 and a second surface 302. The first surface 301 is electrically connected to a second surface 182 of the MEMS microphone chip 18. By stacking the controlling chip 30 on the MEMS microphone chip 18, the MEMS microphone chip 18 can be protected, and the packaging volume can be reduced. Moreover, in this embodiment, the controlling chip 30 can be fixed to the MEMS microphone chip 18 by an adhesive layer 60. Besides, the second surface 302 of the controlling chip 30 is electrically connected to the base 20 through a plurality of conductive wires 22.

The sealing material 70 is formed on the base 20 and covering the MEMS microphone chip 18, the controlling chip 30 and the conductive wires 22 for preventing low-frequency leakage problem. Sealant or primer is used to protect the metal bump 50 of the MEMS microphone chip 18 from corrosion under atmospheric conditions. Since no expensive gold pad is to be used, the cost can be lowered. The sealing material 70 is formed on the base 20 by integrated circuit plastic packaging process.

Figure 2:
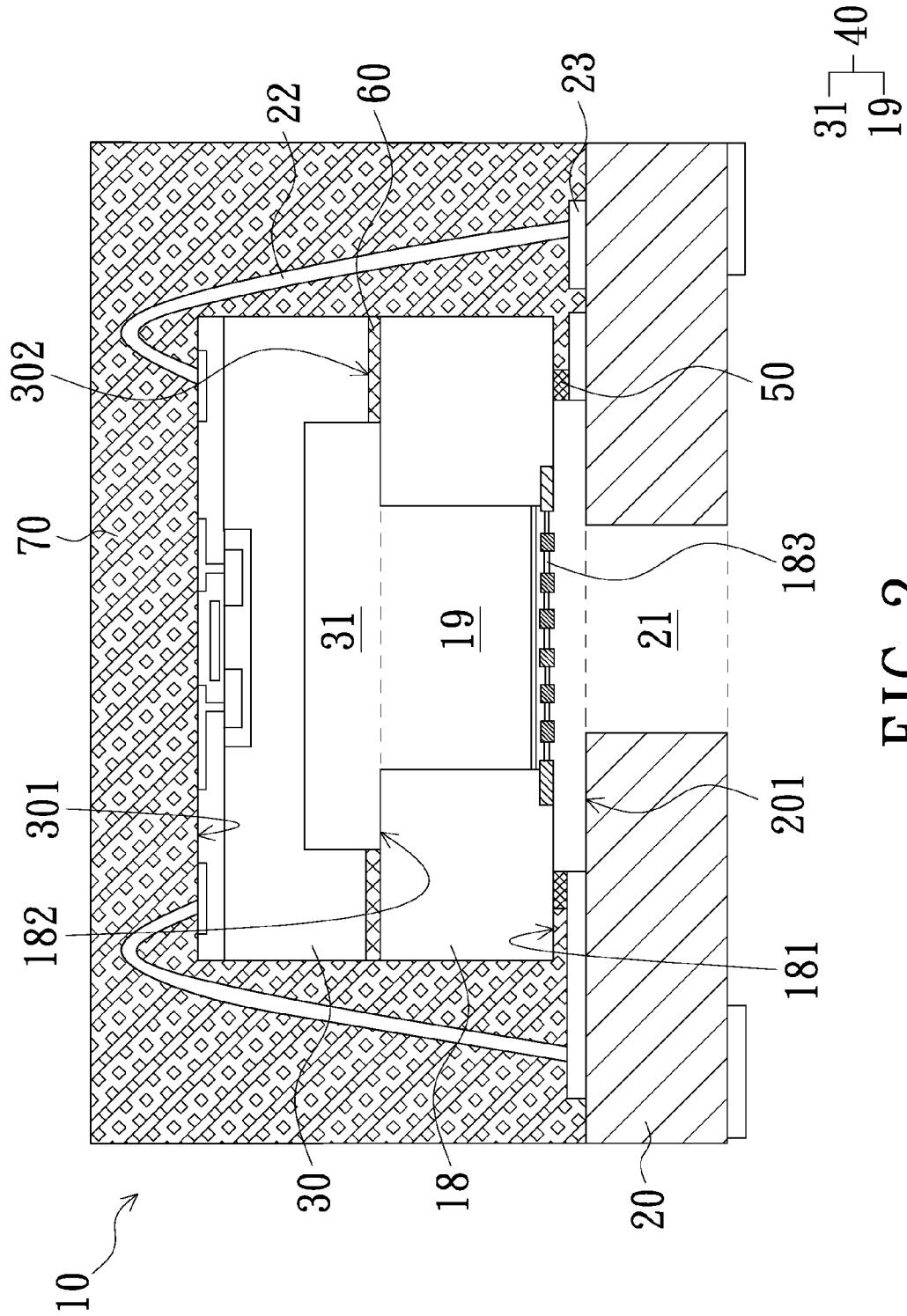
FIG. 2 is a schematic cross sectional view of the MEMS microphone packaging structure according to the first embodiment of the invention.

Please referring to FIG. 2, the second embodiment of the invention is substantially the same as the first embodiment, and the difference is that a recess 31 is further formed on a back surface of the controlling chip 30 and a back cavity 40 is formed by connecting the recess 31 with the deep hole 19 of the MEMS microphone chip 18 for the diaphragm 183. Thus, the sensitivity of the MEMS microphone is improved and the acoustic performance is upgraded.

Figure 3:
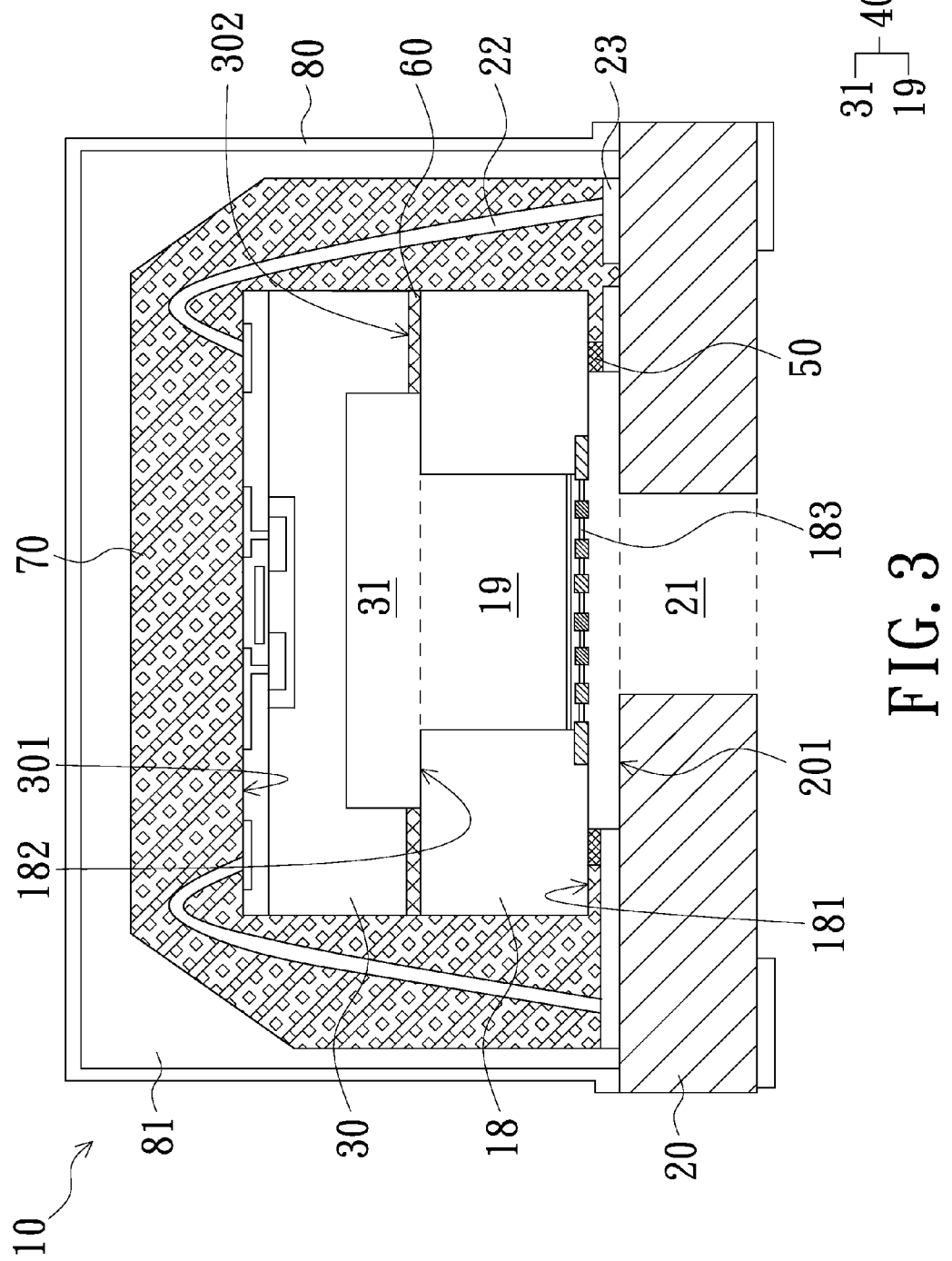
FIG. 3 is a schematic cross sectional view of a MEMS microphone packaging structure according to the second embodiment of the invention.

Please referring to FIG. 3, the third embodiment of the invention is substantially the same as the second embodiment, and the difference is that a metal cover 80 is further provided for connecting to the base 20 in this embodiment. A room 81 is formed between the metal cover 80 and the base 20 for accommodating the conductive wires 22, the controlling chip 30 and the MEMS microphone chip 18 and the sealing material 70. Since the metal cover 80 is provided for protecting the MEMS microphone chip 18 from radio frequency interference or electromagnetic interference, the metal cover 80 is made of metal material or made by applying a conductive layer on a plastic material for preventing interference of radio frequency electromagnetic radiation. In the process, the sealing material 70 is applied by glue dispensing for protecting the MEMS microphone 18, the controlling chip 30 and a plurality of wires 22, and the metal cover 80 is then connected to the base 20 to complete the packaging. In addition to improve the protection against the radio frequency interference of the electromagnetic interference, the stability of the packaging structure is also improved. Besides, the process of the embodiment is simpler, and the manufacturing cost is lowered without influencing the performance.

Figure 4:
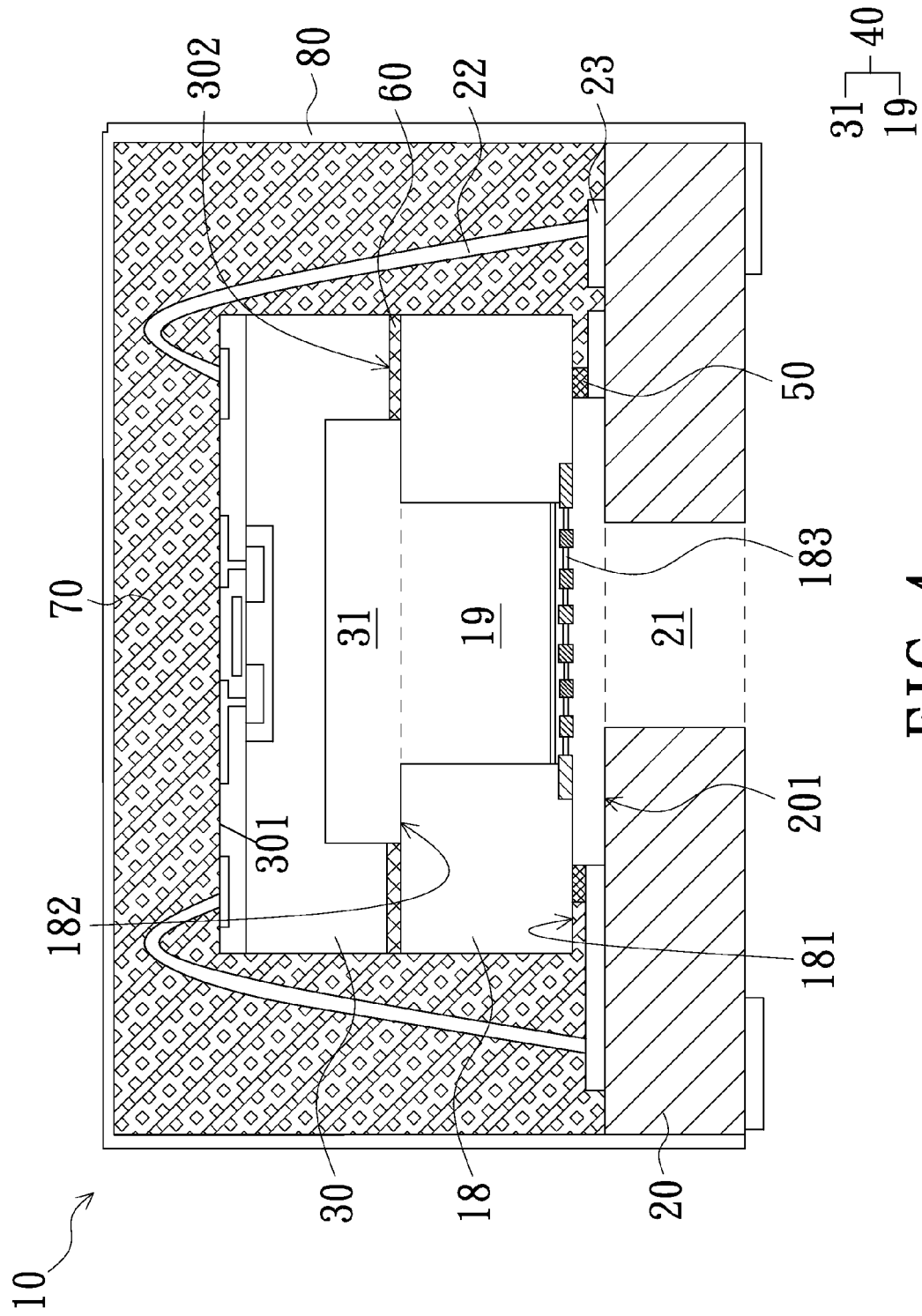
FIG. 4 is a schematic cross sectional view of a MEMS microphone packaging structure according to the third embodiment of the invention.
Figure 5:
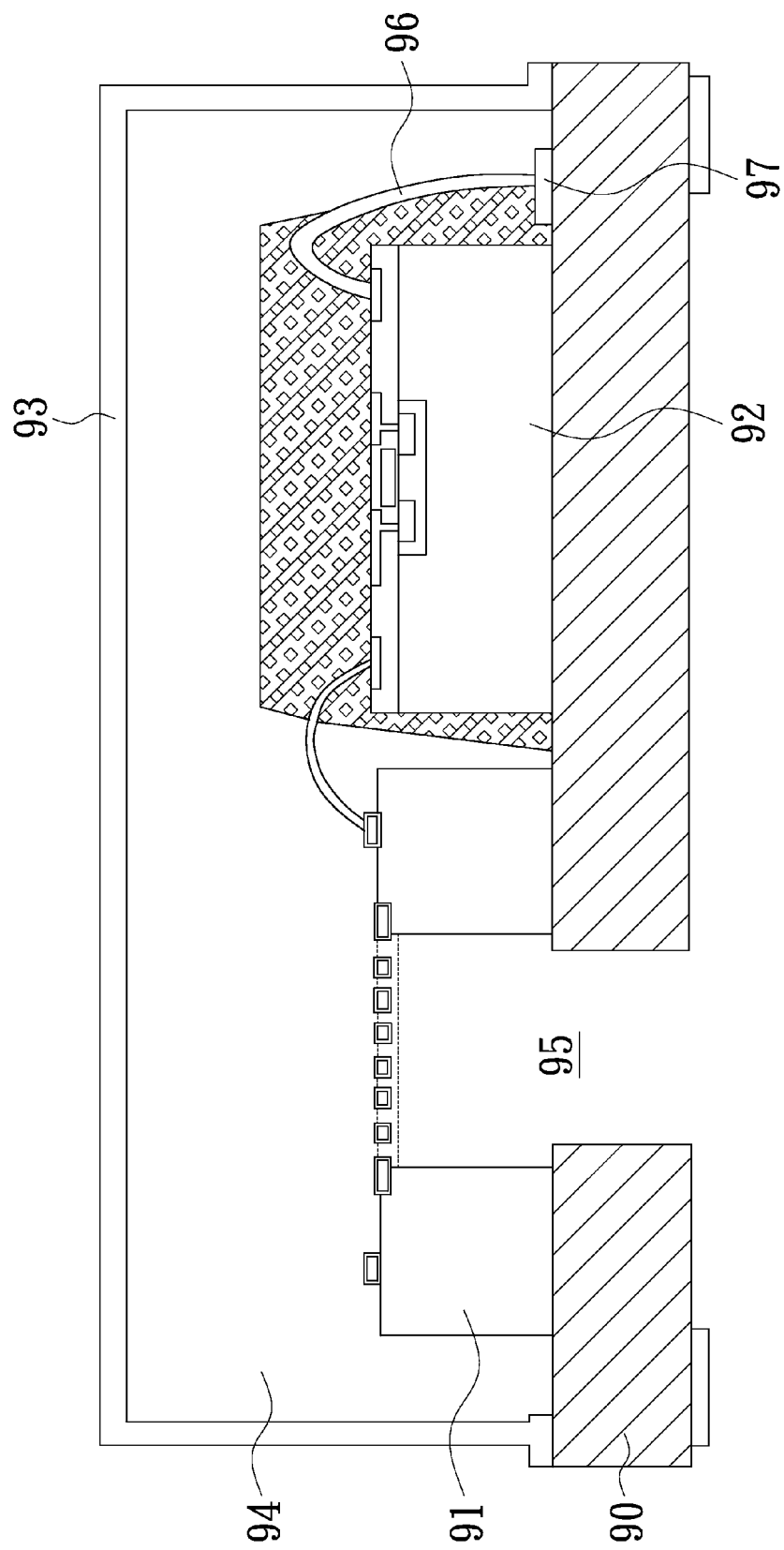
FIG. 5 is a schematic cross sectional view of a conventional MEMS microphone packaging structure.

As FIG. 4 shows, the fourth embodiment is substantially the same as the third embodiment, and the difference is that the sealing material 70 is manufactured in advance and then coated with a metal layer to form the metal cover 80 for improving the protection against the radio frequency interference and the electromagnetic interference, and the stability of the MEMS microphone packaging structure 10 is thus increased. Besides, the sealing material 70 is made by plastic molding technology, and the room formed by the metal cover 80 and the base 20 except for a part for accommodating the conductive wires 22, the controlling chip 30 and the MEMS microphone chip 18 is completely fulfilled by the sealing material 70.

Multiple features are provided through the above mentioned embodiments to improve the conventional technology or apparatus. For example, the controlling chip is stacked on the MEMS microphone chip for the purpose of reducing the size of the base, and the dimensions of the packaging structure can be downsized. Moreover, by connecting the recess of the controlling chip with the deep hole of the MEMS microphone chip, the additional large back cavity is obtained for increasing the sensitivity and the acoustic performance. Besides, by using sealant or primer as sealing material to protect the metal elements such as the metal bumps to prevent corrosion under atmospheric condition, no expensive gold pad is to be used, and the cost can be lowered.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A MEMS microphone packaging structure, comprising:
   a base having a surface and a through hole;
   a MEMS microphone chip having a plurality of metal bumps, a first surface and a second surface, the MEMS microphone chip being electrically connected to the base by means of contacting the surface of the base through the metal bumps, and a deep hole being formed on the second surface of the MEMS microphone chip and extending to the first surface of the MEMS microphone chip;
   a controlling chip having a first surface and a second surface, the first surface of the controlling chip being fixed to and covering the deep hole of the MEMS microphone chip;
   a plurality of conductive wires electrically connected the second surface of the controlling chip with the base; and
   a sealing material covering the base, the MEMS microphone chip, the controlling chip, the conductive wires and the metal bumps arranged between the MEMS microphone chip and the base, wherein the sealing material has a first outer lateral wall, the base has a second outer lateral wall, and the first outer lateral wall trims the second outer lateral wall.

2. The MEMS microphone packaging structure as recited in claim 1, further comprising a metal cover connected to the base for packaging the sealing material, the conductive wires, the controlling chip and the MEMS microphone chip.

3. The MEMS microphone packaging structure as recited in claim 2, wherein the metal cover is made of metal material or made by applying a conductive layer on a plastic material.

4. The MEMS microphone packaging structure as recited in claim 2, wherein a room is formed by the metal cover and the base except for the conductive wires, the controlling chip and the MEMS microphone chip is fulfilled by the sealing material.

5. The MEMS microphone packaging structure as recited in claim 1, wherein the sealing material is made by plastic molding.

6. The MEMS microphone packaging structure as recited in claim 2, wherein the sealing material is made by chip coating.

7. The MEMS microphone packaging structure as recited in claim 2, wherein the sealing material is made by integrated circuit plastic packaging processes.

8. The MEMS microphone packaging structure as recited in claim 1, further comprising an adhesive layer disposed between the controlling chip and the MEMS microphone chip for fixing the controlling chip to the MEMS microphone chip.

9. The MEMS microphone packaging structure as recited in claim 1, wherein the base has a plurality of pads disposed on the surface thereof for electrical connection; the pads contact and are electrically connected to the metal bumps; and the conductive wires respectively connect the pads on the surface of the base to the second surface of the controlling chip.

10. The MEMS microphone packaging structure as recited in claim 1, wherein a portion of the sealing material is disposed between the MEMS microphone chip and the base and fills gaps between the metal bumps.

11. A MEMS microphone packaging structure, comprising:
a base having a surface and a through hole;
a MEMS microphone chip having a diaphragm, a first surface and a second surface, the first surface of the MEMS microphone chip being electrically connected to the surface of the base, and a deep hole being formed on the second surface of the MEMS microphone chip and extending to the first surface of the MEMS microphone chip; and
a controlling chip having a first surface and a second surface, the first surface of the controlling chip being fixed to and covering the deep hole of the MEMS microphone chip, a recess being inwardly formed on the first surface of the controlling chip;
wherein the recess of the controlling chip and the deep hole of the MEMS microphone chip communicating with each other to cooperatively define a back cavity, the back cavity is arranged over the through hole of the base, and the diaphragm is disposed between the back cavity and the through hole of the base.

12. The MEMS microphone packaging structure as recited in claim 11, wherein a first lateral width of the recess is larger than a second lateral width the deep hole.

\* \* \* \* \*